(12) United States Patent
Deboy et al.

(10) Patent No.: US 6,614,090 B2
(45) Date of Patent: Sep. 2, 2003

(54) COMPENSATION SEMICONDUCTOR COMPONENT AND METHOD OF FABRICATING THE SEMICONDUCTOR COMPONENT

(75) Inventors: Gerald Deboy, München (DE); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/974,650

(22) Filed: Oct. 9, 2001

(65) Prior Publication Data

US 2002/0074567 A1 Jun. 20, 2002

(30) Foreign Application Priority Data

Oct. 9, 2000 (DE) .......................... 100 49 861

(51) Int. Cl.[7] .............................................. H01L 23/58
(52) U.S. Cl. ...................... 257/493; 257/329; 257/492
(58) Field of Search ................... 257/329, 342, 257/492, 493

(56) References Cited

U.S. PATENT DOCUMENTS 4,754,310 A * 6/1988 Coe ........................... 257/287
5,216,275 A * 6/1993 Chen ........................... 257/493
6,184,555 B1 * 2/2001 Tihanyi et al. ............... 257/342
6,410,958 B1 * 6/2002 Usui et al. ................... 257/329

FOREIGN PATENT DOCUMENTS

WO  WO 97/29518  8/1997

* cited by examiner

Primary Examiner—David Nelms
Assistant Examiner—Dao H. Nguyen
(74) Attorney, Agent, or Firm—Laurence A. Greenberg; Werner H. Stemer; Ralph E. Locher (57) ABSTRACT

The semiconductor component is a charge carrier compensation component formed in a semiconductor body. A semiconductor basic body is disposed in the semiconductor body. The basic body has at least one compensation layer which adjoins a boundary layer and first regions of a first conductivity type and second regions of a second conductivity type are provided along a layout grid. A total quantity of charge of the first regions corresponds approximately to a total quantity of charge of the second regions. At least one semiconductor layer in the semiconductor body adjoins the semiconductor basic body at the boundary layer. A multiplicity of doped regions are embedded in the first surface of the semiconductor layer which form a grid for a cell array of the semiconductor component. The grid in the semiconductor layer is aligned independently of the layout grid in the semiconductor basic body.

17 Claims, 7 Drawing Sheets

COMPENSATION SEMICONDUCTOR COMPONENT AND METHOD OF FABRICATING THE SEMICONDUCTOR COMPONENT

BACKGROUND OF THE INVENTION

Field of the Invention

The invention lies in the semiconductor technology field. More specifically, the invention relates to a semiconductor component arranged in a semiconductor body according to the principle of charge carrier compensation. The semiconductor component has a semiconductor basic body arranged in the semiconductor body and at least one semiconductor layer arranged in the semiconductor body and adjoining the semiconductor basic body at the boundary layer. The basic body has at least one compensation layer which adjoins the boundary layer and it has first regions of the first conductivity type and second regions of the second conductivity type, which form a grid in the layout. A total quantity of charge of the first regions corresponds approximately to a total quantity of charge of the second regions. The semiconductor layer adjoins the semiconductor basic body at the boundary layer. A multiplicity of doped regions are embedded in the first surface of the semiconductor layer, the doped regions form a grid for a cell array of the semiconductor component.

Furthermore, the invention relates to two methods of fabricating such a semiconductor component.

The invention thus generally relates to semiconductor components according to the principle of charge carrier compensation and, in particular, to the fabrication of such so-called compensation components. The construction and the method of operation of compensation components is known in many cases and described for example in the U.S. Pat. Nos. 5,216,275 and 4,754,310, and also in international PCT publication WO 97/29518 and in German patent DE 43 09 764 C2.

Compensation components are expected in the near future to take a very large market share in particular in the segment of MOS semiconductor components having a high blocking capability; at the present time, the fabrication of such compensation components is still extremely complicated and time-consuming. This can be attributed firstly to the fact that, in contrast to conventional semiconductor components, the structure of a compensation component to be produced is already inherent in the semiconductor body during provision and processing and, therefore, has to be concomitantly taken into account. This means, for example, that in the case of a power MOSFET which is designed as a compensation component and is designed to take up a reverse voltage of 600 volts, for example, a series of five to seven alternating epitaxy and doping steps have to be performed in the construction technique preferably used hitherto. However, the fabrication of a compensation component using epitaxy and doping steps that have to be employed in such an alternating fashion requires a very long time for processing the basic material. A processed basic body is then obtained which, in the region of the active cell array, that is to say below the gate electrode, is prepared in a desired manner.

Furthermore, in conventional compensation components, the cell grid is typically not homogeneous: the cell grid is many times larger in the active region of the cell array than in the edge region, with the result that the edge region and the active region have to be fabricated separately during processing, which is very complicated.

Compared with conventional semiconductor components, which have a homogeneous inner zone grown epitaxially, for example, compensation components have alternating layers of the first and second conductivity types in the grown epitaxial layer. The main difficulty in fabricating compensation components consists in aligning these alternating layers with regard to the grid of the cell array, that is to say they are arranged in a pillar-shaped, v-shaped, u-shaped or similar manner either below the active cell and/or arranged below the gate electrode.

This requirement for aligning the regions of the first and second conductivity types that are introduced into the semiconductor body in a pillar-like manner with the structures of the active cell array makes the entire fabrication process complicated, lengthy and costly.

A further disadvantage of such compensation components is that, for virtually every different cell design, a process for producing the compensation structures which is tailored to the corresponding component in a dedicated manner has to be provided in each case, which process cannot, however, be applied to compensation components having a different cell design. It is thus virtually impossible to decouple the fabrication of the semiconductor basic body and the corresponding cell array. Therefore, for the multiplicity of semiconductor components the corresponding semiconductor basic bodies cannot be preprocessed, which, moreover, also renders the entire fabrication of such compensation components unnecessarily expensive. Furthermore, since in conventional compensation components the actual process for fabricating the transistor structures and the process for fabricating the compensated "starting material" are coupled to one another, these processes cannot be optimized separately.

SUMMARY OF THE INVENTION

It is accordingly an object of the invention to provide a semiconductor compensation component and a corresponding production method, which overcome the above-mentioned disadvantages of the heretofore-known devices and methods of this general type and which compensation components can be fabricated with the least possible degree of complexity and thus cost-effectively. Furthermore, the invention is based on the object of decoupling, in particular, the process for fabricating the basic material of compensation components from the actual processing of the cell structures.

With the foregoing and other objects in view there is provided, in accordance with the invention, a semiconductor component, comprising:

a semiconductor basic body disposed in a semiconductor body;

said basic body having a compensation layer adjoining a boundary and containing a grid layout of first regions of a first conductivity type and second regions of a second conductivity type, wherein a total quantity of charge of said first regions substantially corresponds to the total quantity of charge of the second regions;

a semiconductor layer disposed in the semiconductor body and adjoining said semiconductor basic body at said boundary;

said semiconductor layer having a first surface with a multiplicity of doped regions embedded therein defining a grid for a cell array of the semiconductor component; and wherein an alignment of said grid layout of said first and second regions is independent of said grid for the cell array in said semiconductor layer.

In other words, a semiconductor component arranged in a semiconductor body according to the principle of charge carrier compensation is provided, having a semiconductor basic body arranged in the semiconductor body, which basic body has at least one compensation layer which adjoins a boundary layer and wherein first regions of the first conductivity type and second regions of the second conductivity type are provided, which form a grid in the layout, the total quantity of charge of the first regions approximately corresponding to the total quantity of charge of the second regions, having at least one semiconductor layer arranged in the semiconductor body and adjoining the semiconductor basic body at the boundary layer, in the first surface of which semiconductor layer a multiplicity of doped regions are embedded, which form a grid for a cell array of the semiconductor component, wherein the grid in the semiconductor layer is not aligned with the grid of the semiconductor basic body.

With the above and other objects in view there are furthermore provided two methods for fabricating the component:

Accordingly, provision is made of a method for fabricating a semiconductor component according to the principle of charge carrier compensation, having the following method steps that are carried out one after the other:

a) a semiconductor body is provided;
b) a compensation layer containing doped regions of the first and/or of the second conductivity type is produced in the semiconductor body;
c) a semiconductor layer is applied to the compensation layer;
d) the doped regions for structures of a cell array and of an edge region of a semiconductor component are embedded in the semiconductor layer, the structures of the doped regions not being aligned with a grid of the structures of the compensation layer that are formed by the regions.

In an alternative method, the following method steps are carried out one after the other:

a) a semiconductor body is provided,
b) at a first surface, the doped regions for structures of a cell array and of an edge region of a semiconductor component are embedded in the semiconductor layer;
c) a compensation layer containing doped regions of the first and/or of the second conductivity type is produced by means of a second surface, the structures of the compensation layer not being aligned with a grid of the structures formed by the doped regions of the cell array.

The particular advantage of the present invention is that the fabrication processes for providing a semiconductor basic body can be completely decoupled from the corresponding processes for fabricating the actual structures of the semiconductor component. The new concept here is that only compensated "substrate material" is fabricated, in the case of which the corresponding compensation structures are formed according to the desired dielectric strength and current-carrying capacity of the semiconductor component and which has the corresponding thickness for this. An appropriate semiconductor layer is then applied to this substrate material and only then is the actual process for fabricating the cell structures of the semiconductor component carried out. This substrate material may be prefabricated depending on producibility possibilities and need not be aligned with the actual cell structures of the subsequently applied epitaxial layer on the front side of the wafer. Thus, the present invention presents virtually a modular principle for the further development of compensation components, with the fundamentally new idea of separating the production and optimization of basic material and cell array not aligned therewith.

In compensation components of the generic type, the p-doped pillars are in each case arranged exactly below the body zones and/or below the gate electrodes. In a total departure from the construction of compensation components according to the prior art, the requirement for alignment is obviated in the case of the invention's arrangement of a compensation component.

The compensation structure may, on the one hand, completely occupy the semiconductor basic body. Here, it is typically, but not necessarily, the case that a contact implantation is performed at the rear side of the wafer, which ensures an improvement in the electrical contact to the corresponding rear side electrode. On the other hand, the compensation layer may occupy merely a part of the basic body. The respective other part typically has a higher doping concentration than the compensation layer.

The doping regions of the first and second conductivity types within the compensation layer advantageously extend vertically over the entire thickness of said compensation layer. In a special refinement, these doping regions can be connected to the rear side of the wafer.

In accordance with another feature of the invention, the doping regions of the compensation layer have a fixed spacing relative to one another laterally and extend over the entire width of the compensation layer.

The cell geometry or the grid of the semiconductor layer and also of the compensation layer can have a more or less arbitrary layout. However, it is recommended that structures be used wherein the grid in the cell geometry of the semiconductor layer and in the compensation layer match one another. However, this is not absolutely necessary. Rather, the grid of the cells in the semiconductor layer can differ from the grid in the compensation layer.

Particular advantage is attached to a hexagonal grid, which has the densest packing in terms of area. Further advantageous layouts emerge in the case of a strip-shaped, rectangular or meandering layout. However, round or oval or similar cell structures would also be advantageous.

Furthermore, it is particularly advantageous if the grid of the semiconductor layer is at least partly narrower than the grid in the compensation layer. As an alternative, it may also be provided that the grid of the semiconductor layer is situated more or less perpendicularly on the grid of the compensation layer in plan view. This is particularly advantageous in particular in the case of rectangular or strip-shaped layouts.

Typically, the first regions and/or the second regions in the compensation layer are of approximately pillar-shaped or funnel-shaped design, that is to say they taper into the depth of the compensation layer. Furthermore, spherical structures would also be advantageous. These spherical structures need not necessarily be connected to one another, rather it suffices for them to have a spacing in the region of a space charge zone width when a voltage is applied.

For the function of a compensation component, the total quantity of the doping of the first conductivity type and of the second conductivity type in the compensation layer must be approximately identical. This means that the doping concentrations do not differ from one another to an excessively great extent, that is to say by one or more orders of magnitude. For reasons of stability, it is advantageous if the total quantity of charge carriers of the second conductivity type in the compensation layer is slightly greater than the total quantity of charge carriers of the first conductivity type.

The regions of different conductivity types within the compensation layer are typically connected to one another. However, it would also be conceivable for these regions to have a slight spacing in the region of less than or equal to the space charge zone width when a voltage is applied. In this case, undoped or very lightly doped regions may be provided between the first and the second regions.

The invention is particularly advantageously suited to semiconductor components designed as power MOSFETs. A power MOSFET is designed as a semiconductor component which is arranged in a cell array and wherein a multiplicity of individual transistors arranged in a respective cell are provided, which transistors are connected in parallel by their load paths to form a single semiconductor component. Typically, each of these cells in each case has a body zone embedded in the semiconductor layer, wherein body zone, in turn, at least one source zone of the opposite conductivity type is embedded. Furthermore, a power MOSFET has a drain electrode on the rear side of the wafer and, on the front side of the wafer, a source electrode which makes contact with the source zones. Respectively adjacent body zones are spaced apart by an intermediate zone above which a gate electrode insulated by means of a gate oxide is arranged.

The semiconductor layer typically has a basic doping of the first conductivity type. In a special refinement, the semiconductor layer may also have a basic doping of the second conductivity type. In this case, the intermediate zones and the body zones formed from the basic doping of the semiconductor layer extend over the entire thickness of the semiconductor layer and are connected to the compensation layer. Such a design of the semiconductor layer with charge carriers of the second conductivity type is recommended when designing a defined breakdown of the semiconductor component in the breakdown situation, thereby ensuring better stability of the semiconductor component. In a further refinement, the semiconductor layer may also be weakly doped or even undoped. In this case, however, the intermediate zones arranged between the base zones should have a high doping of the first conductivity type.

A semiconductor component of the generic type typically has an active region, which is arranged in a cell array of the semiconductor component, and an edge region as edge termination of the semiconductor component. The particular advantage of the present invention consists, inter alia, also in the fact that the grid may be identical below the cell array and below the edge region. It is not necessary, therefore, to provide a separate process for the regions below the cell array and the edge region, as a result of which the semiconductor components can be fabricated with a lower degree of complexity and thus more cost-effectively.

In a first method according to the invention, for fabricating a compensation component, firstly a semiconductor basic body is provided which has a compensation layer having regions of the first and second conductivity types. A semiconductor layer is subsequently applied on said semiconductor basic body with compensation layer, a multiplicity of doped regions of one and/or the other conductivity type being embedded in the surface of said semiconductor layer. What is essential in this case is that the grid of the doped regions embedded in the semiconductor layer is not aligned with the grid of the compensation layer.

In accordance with a further advantageous method, a semiconductor body is provided in whose first surface doped regions of the first and/or of the second conductivity type are embedded. These doped regions thus form a grid for a cell array of a semiconductor component. Afterward, the semiconductor body is optionally thinned from the opposite, second surface as far as a predetermined thickness. Regions of the first and/or of the second conductivity type are then introduced from the second surface into the semiconductor body in such a way that a compensation layer is formed. These are advantageously not connected to the doped regions at the first surface. What is essential here, too, is that the grid of the compensation layer does not have to be aligned with the grid of the cell array.

A high energy implantation with different energies and doping doses is advantageously performed for the purpose of producing the first and/or the second regions within the compensation layer. An implantation mask fabricated from a thin silicon wafer can advantageously be used for such a high energy implantation. Such an implantation mask has cutouts in the implantation mask at the regions to be doped. The remaining regions of the mask form, during implantation, a perfect screen for the regions that are not to be doped. Moreover, such a mask can be fabricated in a very simple manner.

Other features which are considered as characteristic for the invention are set forth in the appended claims.

Although the invention is illustrated and described herein as embodied in a compensation semiconductor component and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
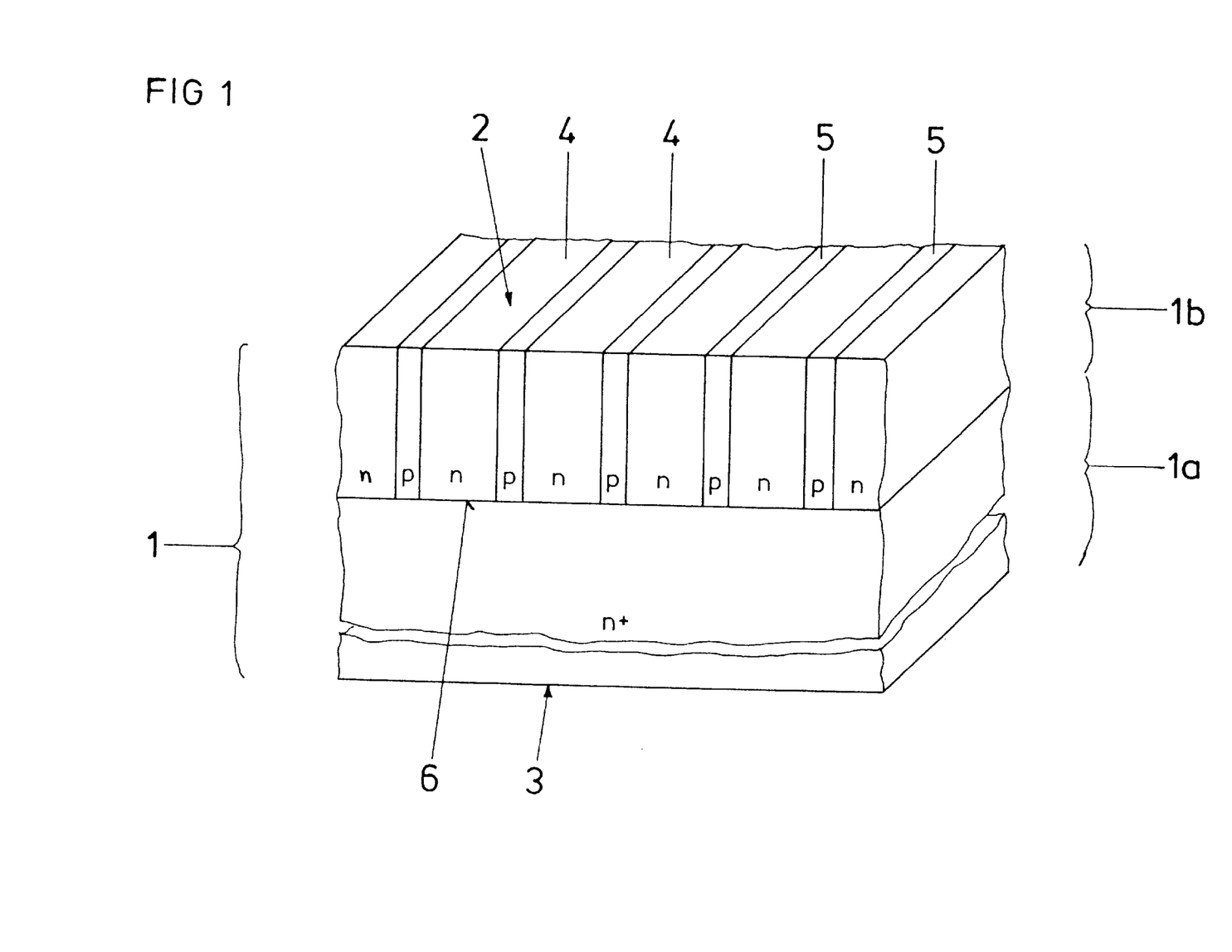
FIG. 1 is a diagrammatic perspective view of a detail of a basic material suitable for high voltages for a compensation component according to the invention.

Referring now to the figures of the drawing in detail and first, particularly, to FIG. 1 thereof, there is shown, in a perspective view, a detail of a basic body according to the invention for a compensation component. The basic body 1 of FIG. 1, by way of example, is a silicon wafer. The basic body 1 has a first surface 2, the so-called front side of the wafer, and a second surface 3, the so-called rear side of the wafer. The basic body 1 has two partial regions 1a, 1b separated by a boundary interface 6. The first partial region 1a, which is also designated as a substrate region hereinafter, is heavily n-doped in the present exemplary embodiment and designates the semiconductor basic material of the basic body 1. The first partial region 1a adjoins the rear side 3 of the wafer in a large-area manner.

Doping regions 4, 5 of both conductivity types which are arranged alternately next to one another are provided in the partial region 1b, which is also designated as compensation layer hereinafter. In the present exemplary embodiment, the n-doped regions 4 and p-doped regions 5 are designed in a laterally strip-shaped and vertically pillar-shaped manner. The p-doped regions 5 are also designated as depletion zones hereinafter, while the n-doped regions are designated as complementary depletion zones. The regions 4, 5 extend in the compensation layer 1b from the front side 2 of the wafer through the entire compensation layer 1b as far as the boundary 6, in other words they are connected to the substrate region 1a.

In the present exemplary embodiment, the compensation layer 1b is designed as an epitaxial layer grown by deposition of n-doped silicon onto the boundary layer 6. The depletion zones 5 can subsequently be introduced into the basic body 1 by suitable methods which will be discussed in more detail below. It would also be conceivable for a p-doped or undoped epitaxial layer 1b to be deposited, into which n-doped regions 4 and/or p-doped regions 5 are introduced. As an alternative, it would also be conceivable to provide an n-doped basic body 1 wherein the highly doped substrate region 1a is produced by customary doping methods and wherein the p-doped depletion zones 5 are subsequently produced from the front side 2 of the wafer.

Figure 2:
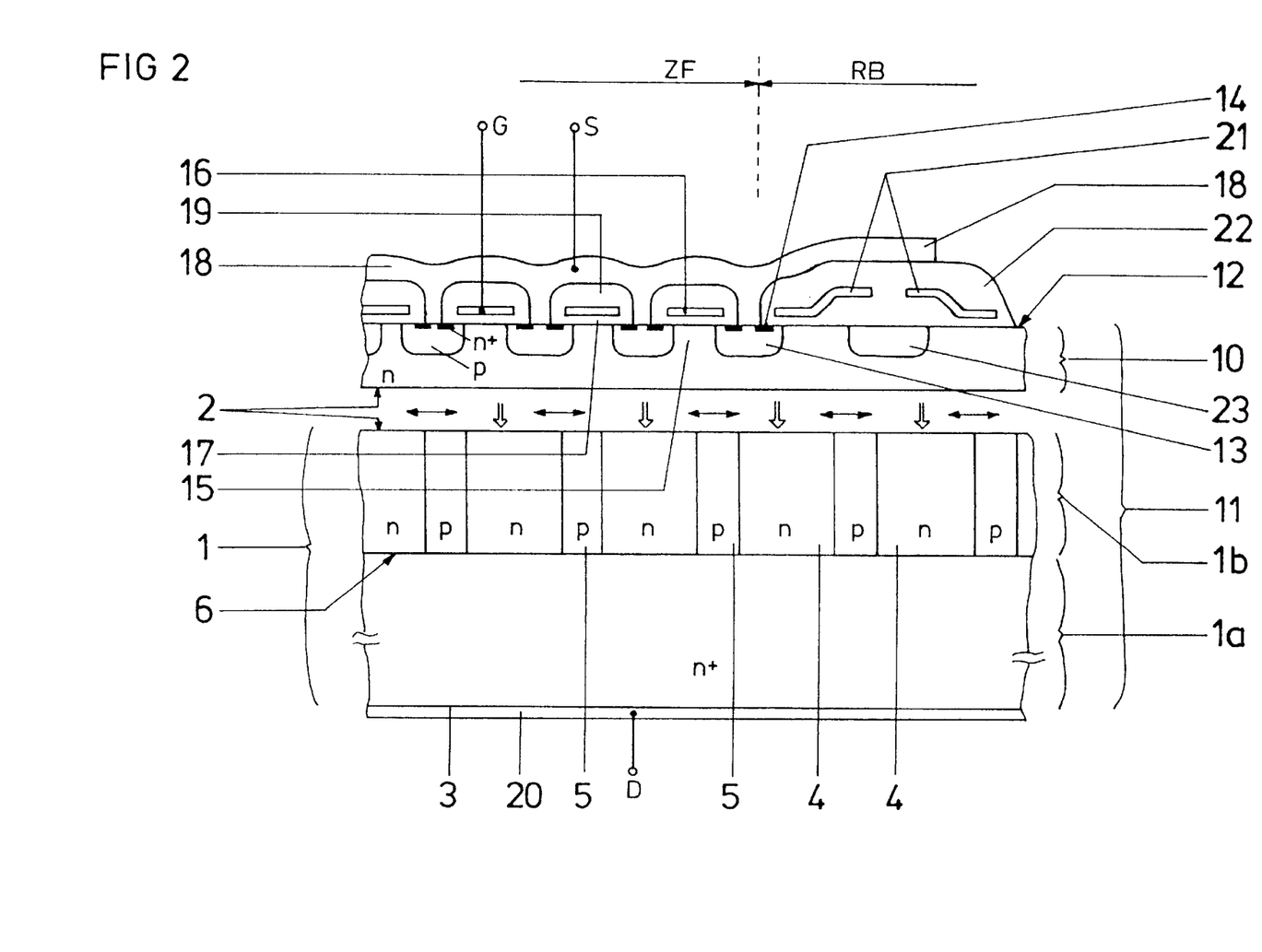
FIG. 2 is a partial section of a first exemplary embodiment of a compensation component according to the invention with a prefabricated silicon basic body.

FIG. 2 shows, in a partial section, a first exemplary embodiment of a compensation component according to the invention with a prefabricated silicon basic body.

In FIG. 2, a further, n-doped epitaxial layer 10 is applied to the basic body, designated by 1. This is illustrated in FIG. 2 by the vertical arrows between epitaxial layer 10 and semiconductor basic body 1. The semiconductor basic body 1 and the epitaxial layer 10 thus form the semiconductor body 11. At the surface 12 of the semiconductor body 11, a plurality of p-doped body zones 13 are embedded in the epitaxial layer 10. One or a plurality of heavily n-doped source zones 14 are embedded in a respective body zone 13. The body zones 13 and sources zones 14 can be introduced in a known manner by ion implantation or diffusion into the semiconductor body 11 and/or be applied to the semiconductor body 11 by epitaxy. The body zones 13 are spaced apart from one another at the surface 12 by an intermediate zone 15, which has the doping of the epitaxial layer 10. Provided above each of the intermediate zones 15 is a gate electrode 16, which extend laterally running as far as the source zones 14. The gate electrodes 16 are insulated from the surface 12 by means of a thin gate oxide 17. Furthermore, a source metallization layer 18 is provided, which electrically contact-connects the source zones 14 and body zones 13 via a shunt and is spaced apart from the gate electrode 16 by a protective oxide 19. At the rear side 3 of the wafer of the semiconductor body 11, a drain metallization layer is applied in a large-area manner, said layer being connected to the drain terminal D. At the front side of the semiconductor body 11, the source metallization layer 18 is connected to a source terminal S and the gate electrode 16 is connected to a gate terminal G.

In the layout of the semiconductor body 11, the regions covered by gate electrodes 16 and also by body zones 13 and source zones 14 designate the compensation component's cell array ZF comprising a multiplicity of cells. Each cell comprises an individual transistor. The MOSFET of the compensation component is produced by the load paths of the multiplicity of individual transistors being connected in parallel. A compensation component typically also has an edge region RB, which is arranged outside the cell array ZF and is intended to ensure a defined profile of the field lines in the edge region during operation of the compensation component.

Field plates 21 are provided in the edge region RB, which field plates are likewise insulated from the semiconductor body 11 and from the source metallization layer 18 by a protective oxide 22. Below the region of the field plates 21, a p-doped well 23 is embedded in the epitaxial layer 10, which, however, is not connected via an electrode, that is to say it is thus at an indeterminate potential.

The gate electrodes 16 are typically composed of polysilicon, but they can also be composed of a different material, for example, metal or silicide, although these materials are not as advantageous as highly doped polysilicon in terms of fabrication engineering and an on account of their physical and electrical properties. Equally, for the gate oxide 16 and protective oxide 19, 22, instead of silicon dioxide ($SiO_2$), it is also possible to use any other insulating material, for example silicon nitride ($Si_3N_4$), or alternatively a vacuum, but thermally fabricated silicon dioxide, particularly for the use as gate oxide, has the highest quality and is therefore preferred. Aluminum is typically used as the source metallization layer 18 and drain metallization 20, but in this case, too, any other highly conductive material or metal which ensures good contact to the semiconductor body could be used.

What is essential to the invention in the arrangement in accordance with FIG. 2 is that the epitaxial layer 10 containing the cell array and the edge region is not aligned with the basic body 1 and hence the compensation layer 1b. This fact is shown in FIG. 2 by the horizontal arrows between the basic body 1 and the epitaxial layer 10. The spacing between epitaxial layer 10 and basic body 1 was inserted in FIG. 2 only to illustrate this invention. When the compensation component is fabricated, such a spacing does not, of course, exist, in other words the epitaxial layer 10 is applied directly to the semiconductor basic body 1.

The method of operation of the structure shown in FIG. 2 is briefly explained below.

At a low drain voltage, the conductivity in the compensation layer 1b is good since the n-doped regions 4 are at low impedance. If the drain voltage is increased, then at a low drain voltage, for example a voltage of less than 30 volts, the p-doped depletion zones 5 and the n-doped regions 4 are mutually depleted. In the case of a further voltage increase, the vertical field strength is increased further and the epitaxial layer 10 takes up voltage. The coupling of the p-doped body zones 13 to the p-doped depletion zones 5 can in this case already be effected at a low voltage in a known manner by means of a punch-through effect. What is essential is that a punch-through between the two regions 5, 13 already takes place at low voltages, that is to say that the space charge zone width passes into the region of the spacing A between p-doped region 5 and body zone 13 as early as during switch-on. In this way, the depletion zone 5 is brought to the potential of the body zone 13 and the regions 4, 5 can be mutually depleted.

Further exemplary embodiments of a compensation component according to the invention are described below with reference to FIGS. 3 to 5.

Figure 3:
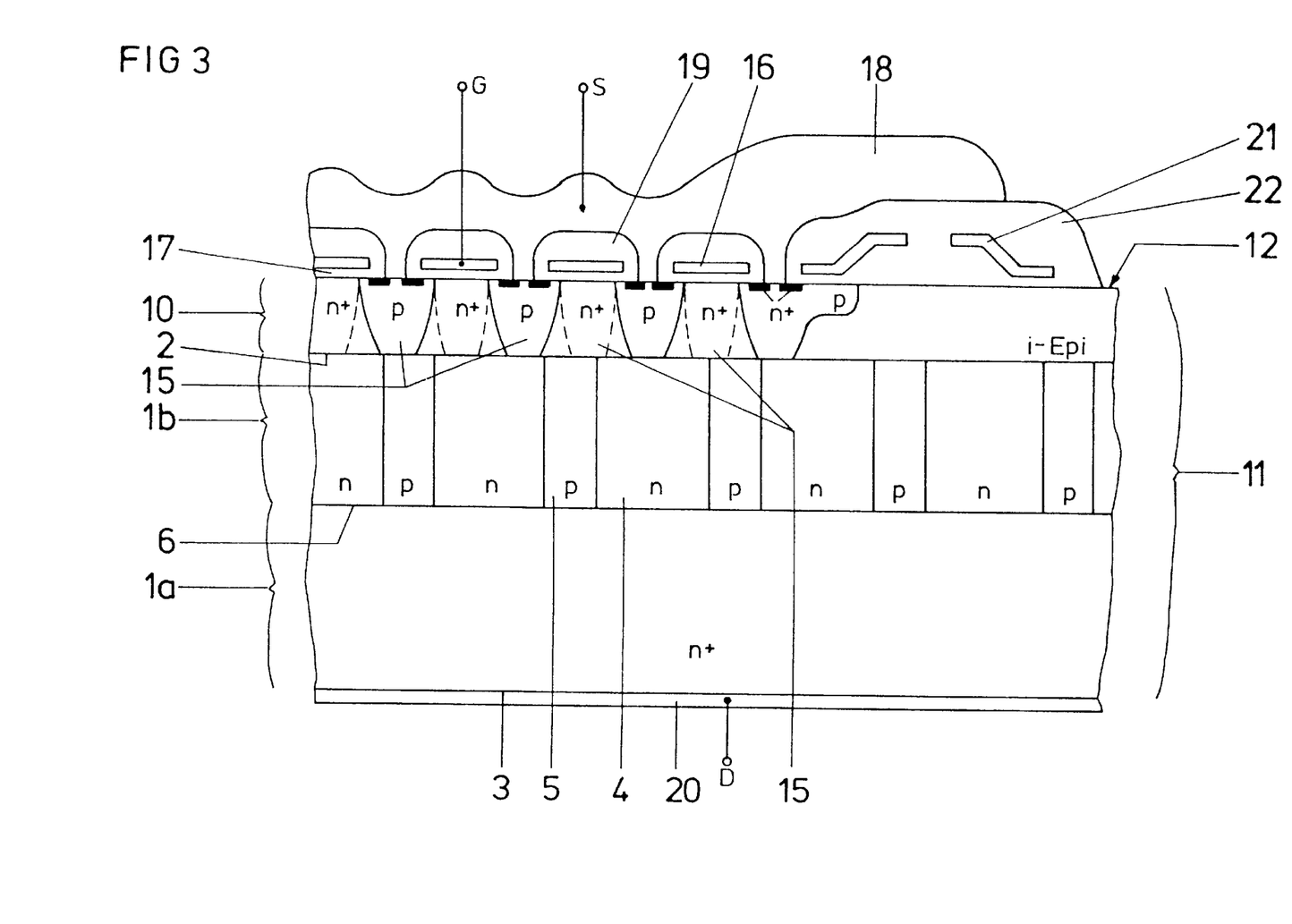
FIG. 3 is a partial section of a second exemplary embodiment of a compensation component according to the invention.

The compensation component in accordance with FIG. 3 is distinguished, as compared with the component of FIG. 2, by the fact that the epitaxial layer 10 is undoped or has a very low doping (i-Epi). The p-doped wells 13 and also the n-doped intermediates zones 15 extend as far as the compensation region 1b or at least into the immediate vicinity of the compensation region 1b.

Figure 4:
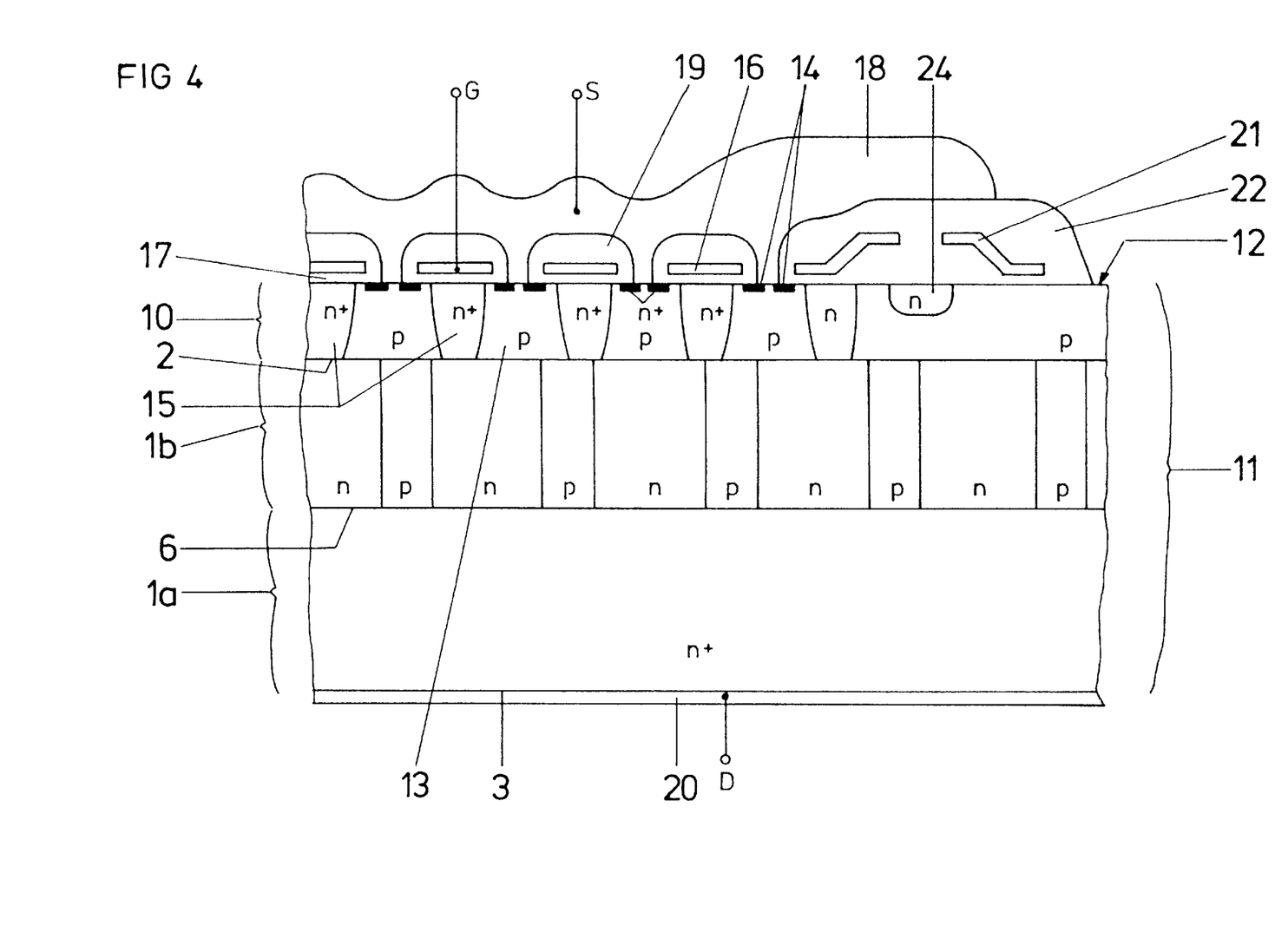
FIG. 4 is a partial section of a third exemplary embodiment of a compensation component according to the invention.

In FIG. 4, the epitaxial layer 10 is p-doped. The body zones 13 are formed directly by the epitaxial layer 10 in this case. In this case, the heavily n-doped intermediate zones 15 extend as far as the compensation layer 1b and thus space apart adjacent body zones 13 from one another. This heavy p-loaded design of the epitaxial layer 10 containing the individual cells is particularly advantageous in particular for reasons of a defined voltage breakdown of the compensation component in the breakdown situation and thus for ensuring better stability. Furthermore, the arrangement in FIG. 4—in an equivalent manner to that in FIG. 2—has an n-doped zone 24 in the edge region below the field plates 21.

Figure 5:
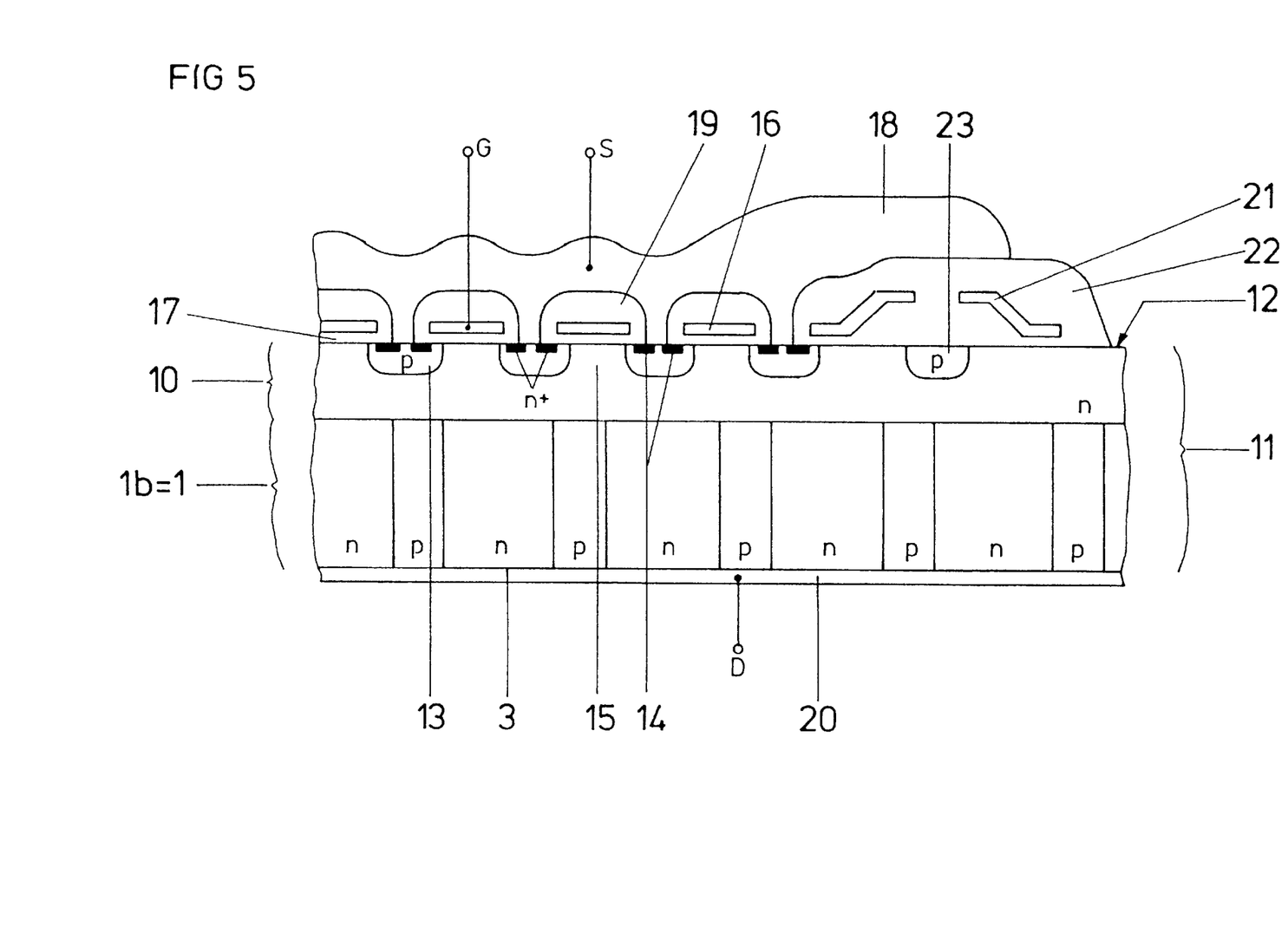
FIG. 5 is a partial section of a fourth exemplary embodiment of a compensation component according to the invention.

FIG. 5 shows a further exemplary embodiment of a compensation component according to the invention. FIG. 5 differs from the exemplary embodiment in FIG. 2 by the fact that the semiconductor basic body 1 completely comprises the compensation layer 1b, in other words a substrate region 1b as in the above exemplary embodiments is not present here. Typically, the compensation layer 1b contains, at the rear side of the wafer, a thin, heavily n-doped contact implantation (not illustrated in FIG. 5) for ensuring a defined electrical contact to the drain metallization layer 20.

Two fundamentally different methods for fabricating a compensation component according to the invention are explained in more detail below with reference to FIGS. 6 and 7. In this case, only the principle shall be explained; the individual detailed process steps for fabricating the individual structures, which are well known to the person skilled in the art, will not be explained in addition.

Figure 6A:
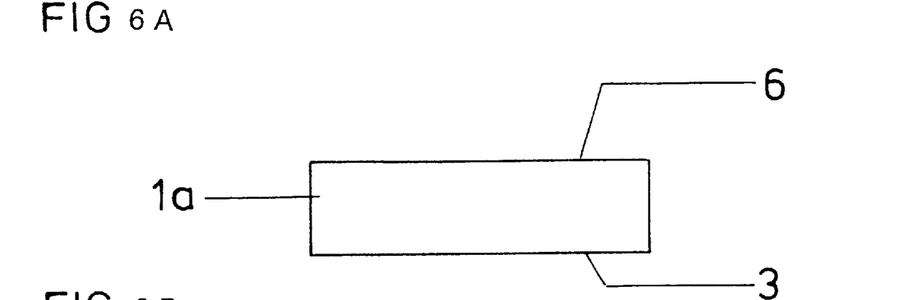
FIGS. 6A–6D are diagrammatic partial sections showing a sequence of a first method according to the invention for fabricating a compensation component.
Figure 6B:
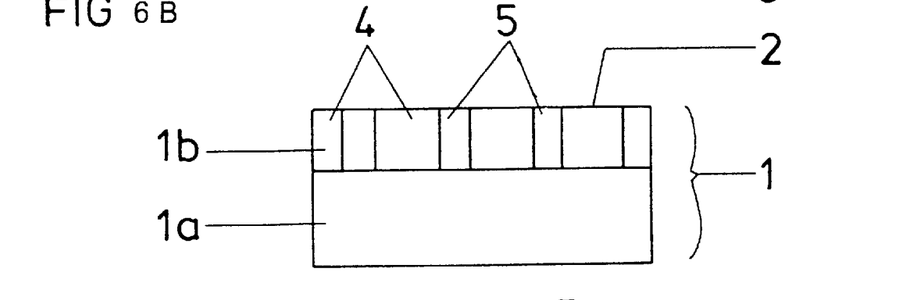
Figure 6C:
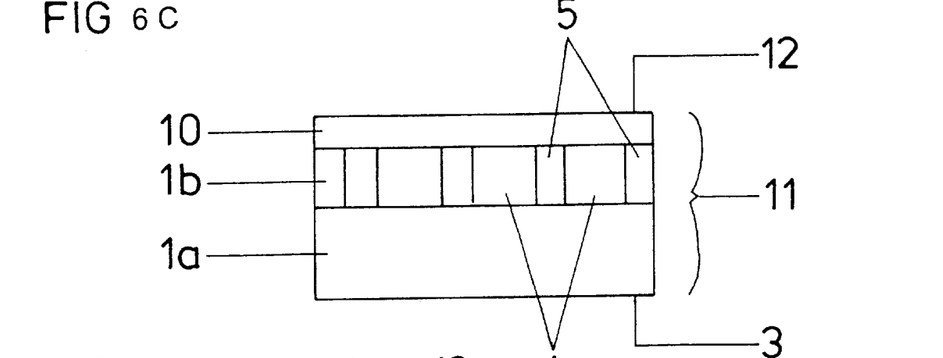
Figure 6D:
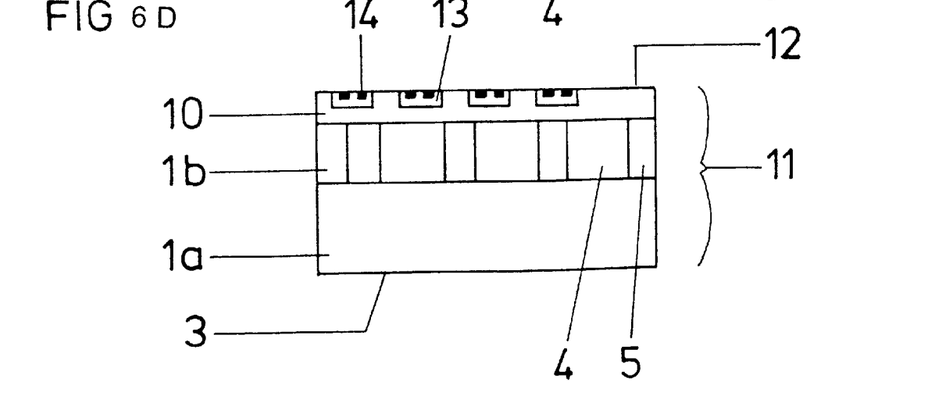

First Method (FIG. 6):

A semiconductor body 1a—for example a silicon wafer—is provided in FIG. 6A. The compensation layer 1b containing the n-doped and p-doped regions 4, 5 is applied to this semiconductor body 1a. See FIG. 6B. This results in a semiconductor basic body 1 with a compensation layer 1b and a substrate region 1a. An epitaxial layer 10 is applied to the semiconductor basic body 1, which thus form the semiconductor body 11. See FIG. 6C. The individual structures of the cell array and of the edge region, that is to say the individual doping regions, can then be introduced into the semiconductor layer 10 by means of suitable process steps. See FIG. 6D. No alignment whatsoever with the structures of the compensation layer is necessary, however, for the individual process steps in the method step of FIG. 6D, that is to say the masking of the semiconductor body 1 for fabricating the doping structures can be effected more or less arbitrarily. Consequently, a semiconductor component in accordance with FIGS. 2 to 4 is provided by method steps (A) to (D). In order to obtain a semiconductor component in accordance with FIG. 5, the semiconductor body 11 merely has to be etched or ground thin from the rear side of the wafer until there is no longer a substrate region 1a.

Figure 7A:
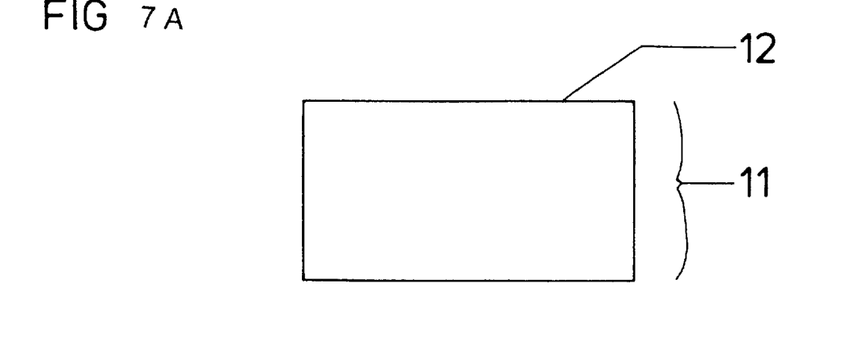
FIGS. 7A–7D are diagrammatic partial sections showing a second method according to the invention for fabricating a compensation component.
Figure 7B:
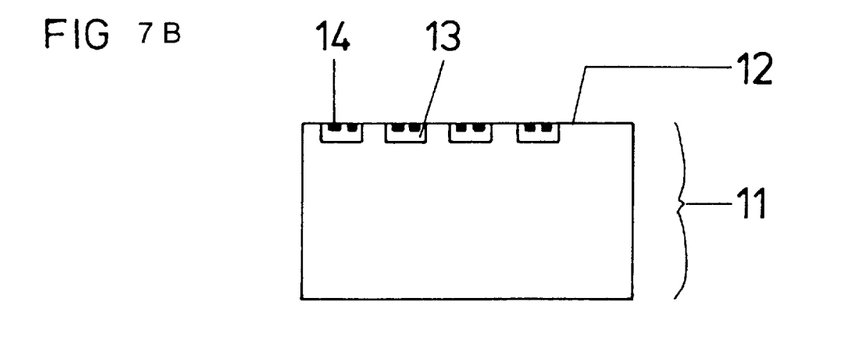
Figure 7C:
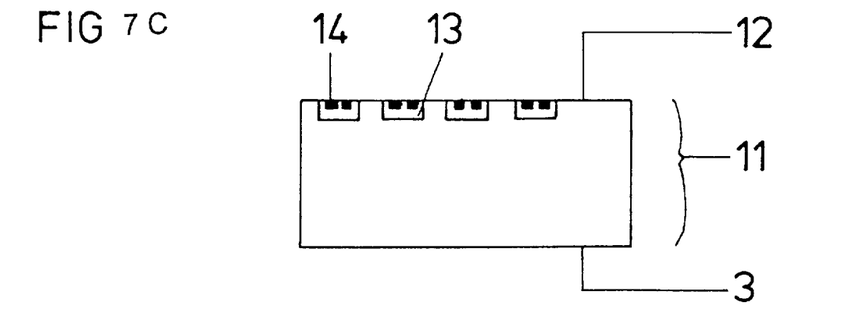
Figure 7D:
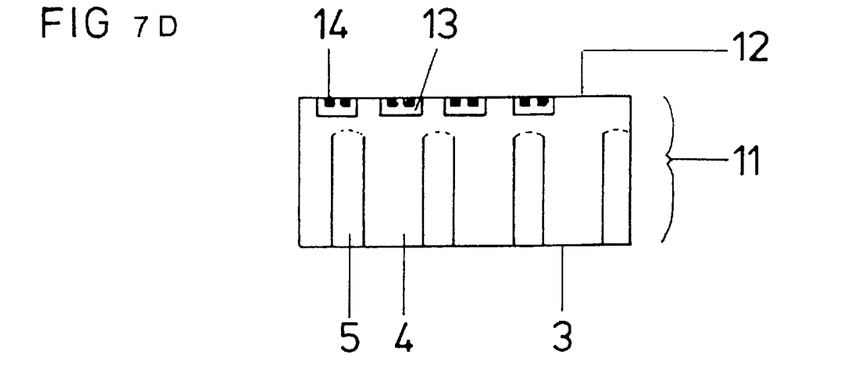

Second Method (FIG. 7):

First, a semiconductor body 11 is provided, FIG. 7A. The structures (13, 14) of the cell array and of the edge region are introduced into the semiconductor body 11 by suitable processing steps. See FIG. 7B. Then, if necessary, the semiconductor body 11 can be etched or ground thin from the rear side of the wafer. See FIG. 7C. Afterward, the n-doped and p-doped regions 4, 5 are introduced into the semiconductor body 11 from the rear side of the wafer. See FIG. 7D. This results in a compensation component in accordance with FIG. 5. For a compensation component in accordance with FIGS. 2 to 4, the heavily n-doped region would additionally have to be applied to the compensation layer 1b, for example by ion implantation, from the rear side of the wafer. In an equivalent manner to that in the first method described above, no alignment of the compensation structures has to be performed for the fabrication of the compensation layer 1b.

The particular advantage of this second method is that the regions 13, 14 can be introduced directly into the semiconductor body 11 without necessitating a process step provided specifically for this purpose. It goes without saying, however, that the regions 13, 14 can also be embedded in an epitaxial layer after the latter has been grown.

A plurality of methods can be used to fabricate the n-doped and p-doped regions 4, 5 of the compensation layer 1b, from which methods a few particularly advantageous ones are described briefly below:

A. The regions 4, 5 in the compensation layer 1b can be produced using the known construction technology by alternate deposition of n-doped silicon and subsequent masked doping, for example by ion implantation or diffusion. By providing a plurality of these deposition and doping steps, it is possible to provide a desired thickness depending on the desired dielectric strength and/or current-carrying capacity of the compensation component.

B. A further possibility is afforded by high energy implantation. For the case where the compensation layer 1b has a doped basic coating, a desired pillar-like structure can be produced by means of a masked compartment-type implantation with staggered energies and implantation doses. By means of high energy implantation, implantation depths of up to in excess of 50 $\mu$m can be achieved with implantation energies of up to 20 MeV, depending on the doping element. Thus, during high energy implantation, the compensation pattern and hence the grid are implanted in the compensation layer 1b only after the process of thinning by grinding from the rear side. Since the pillar-like structures for the regions 4 and/or 5 are implanted from the rear side to a point close beneath the body zones, it is essential here that tolerances during the production of the individual layers and during the implantation can be controlled very exactly.

C. A further method is afforded by the electrolytic etching of tubes into the compensation layer. This method is described for example in European patent application EP 0 621 355 A2, the entire contents of which are incorporated by reference in the subject matter of the present patent application. In these methods, the basic doping of the semiconductor body can be chosen very favorably with regard to the etching. Only after the tubes have been etched is the semiconductor body doped by known doping methods. The doping can be effected by deposition of a doped layer into the tubes and indiffusion of dopants from said layer into the semiconductor body. Afterward, p-doped material can be deposited into the tubes, thereby filling the latter.

The invention is suited in particular to compensation components designed as MOSFETs. However, the invention shall not be restricted to MOSFETs, but rather can be extended within the scope of the invention to any desired semiconductor components, for example JFETs, IGBTs and the like.

The invention shall not be restricted exclusively to the exemplary embodiments in accordance with FIGS. 2 to 5 and the methods in accordance with FIGS. 6 and 7. Rather, a multiplicity of new component variants can be specified there for example by exchanging the conductivity types n for p. With regard to further exemplary embodiments, reference is also had to the above-noted documents U.S. Pat. Nos. 5,216,275, 4,754,310; international published application WO 97/29518, and German patent DE 43 09 764 C2. These documents and their entire contents are hereby incorporated by reference into this text.

To summarize, it can be stated that through the separation of semiconductor basic body and cell region, which, in a total departure from compensation components according to the prior art, do not have to be aligned relative to one another, process-intensive steps can be decoupled in a simple but nonetheless highly effective manner. The individual process steps can be optimized separately from one another.

The present invention has been set forth using the above description in such a way as to clarify as well as possible the principle of the invention and the practical application thereof. It goes without saying that the present invention can be realized in a suitable manner in manifold embodiments and modifications within the scope of those of skill in the pertinent art.

We claim:

1. A semiconductor component, comprising:
    a semiconductor basic body disposed in a semiconductor body;
    said basic body having a compensation layer adjoining a boundary and containing a grid layout of first regions of a first conductivity type and second regions of a second conductivity type, wherein a total quantity of charge of said first regions substantially corresponds to the total quantity of charge of the second regions;
    a semiconductor layer disposed in the semiconductor body and adjoining said semiconductor basic body at said boundary;
    said semiconductor layer having a first surface with a multiplicity of doped regions embedded therein defining a grid for a cell array of the semiconductor component; and
    said grid layout of said first and second regions not being aligned with said grid for the cell array in said semiconductor layer.

2. The semiconductor component according to claim 1, wherein said semiconductor basic body is occupied substantially completely by said compensation layer and wherein a second surface of said semiconductor basic body carries a thin contact implantation region for improving an electrical contact at the second surface.

3. The semiconductor component according to claim 1, wherein said semiconductor basic body has a substrate region of the first conductivity type disposed outside said compensation layer, and at least one of said first and second regions have a lower doping concentration than said substrate region.

4. The semiconductor component according to claim 1, wherein at least one of said first and second regions extend vertically over an entire thickness of said compensation layer.

5. The semiconductor component according to claim 1, wherein at least one of said first and second regions extend laterally over an entire width of said compensation layer and have a fixed spacing relative to one another.

6. The semiconductor component according to claim 1, wherein at least one of said grid in said semiconductor layer and said grid layout in said compensation layer is defined with a layout selected from the group consisting of round, strip-shaped, rectangular, hexagonal, and meandering.

7. The semiconductor component according to claim 1, wherein said grid of said semiconductor layer is narrower than said grid layout of said compensation layer.

8. The semiconductor component according to claim 1, wherein said grid of said semiconductor layer is situated perpendicularly on said grid layout of said compensation layer, in a plan view.

9. The semiconductor component according to claim 1, wherein at least one of said first and second regions in said compensation layer include structures selected from the group consisting of substantially spherical, pillar-shaped, and funnel-shaped structures.

10. The semiconductor component according to claim 1, wherein a total quantity of charge carriers of the second conductivity type in said compensation layer is slightly greater than a total quantity of charge carriers of the first conductivity type.

11. The semiconductor component according to claim 1, wherein a charge per unit area in one of said first and second regions decreases from said first surface into a depth of said compensation layer.

12. The semiconductor component according to claim 1, wherein said first regions and said second regions in said compensation layer have a spacing relative to one another of greater than or equal to zero and less than or equal to a width of a space charge zone when a drain voltage is applied.

13. The semiconductor component according to claim 1, wherein:
    at least one body zone of the second conductivity type is embedded in said first surface of said semiconductor layer, each said body zone has at least one source zone of the and conductivity type embedded in said body zone;
    adjacent said body zones are spaced apart from one another by an intermediate zone of the first conductivity type;
    source zone is in each case contact-connected through a source electrode;
    a gate electrode, spaced apart by a gate oxide, is disposed at least above the intermediate zones; and
    a drain electrode disposed at a surface of said semiconductor basic body.

14. The semiconductor component according to claim 13, wherein said semiconductor layer has a basic doping of the second conductivity type, and said body zones and said intermediate zones each extend from said first surface as far as said boundary.

15. The semiconductor component according to claim 1, wherein said semiconductor layer is more heavily doped with a doping of the first conductivity type than said intermediate zone.

16. The semiconductor component according to claim 1, wherein said semiconductor layer is heavily doped with a doping of the first conductivity type and said intermediate zone is substantially undoped.

17. The semiconductor component according to claim 1, which comprises an active region in which said cell array is arranged, and an edge region, via which field lines are defined from said semiconductor body in a defined manner when a voltage is applied to the semiconductor component, said grid layout of said compensation layer being identical below said cell array and below said edge region.

* * * * *